United States Patent
Bernstein

(10) Patent No.: US 10,746,781 B2
(45) Date of Patent: Aug. 18, 2020

(54) RING OSCILLATOR TEST CIRCUIT

(71) Applicant: Ariel-University Research and Development Company Ltd., Ariel (IL)

(72) Inventor: Joseph B. Bernstein, Hashmonaim (IL)

(73) Assignee: Ariel-University Research and Development Company Ltd., Ariel (IL)

( * ) Notice: Subject to any disclaimer, the term of this patent is extended or adjusted under 35 U.S.C. 154(b) by 190 days.

(21) Appl. No.: 15/557,485

(22) PCT Filed: May 5, 2016

(86) PCT No.: PCT/IL2016/050476
§ 371 (c)(1),
(2) Date: Sep. 12, 2017

(87) PCT Pub. No.: WO2016/178232
PCT Pub. Date: Nov. 10, 2016

(65) Prior Publication Data
US 2018/0246161 A1 Aug. 30, 2018

Related U.S. Application Data

(60) Provisional application No. 62/156,957, filed on May 5, 2015.

(51) Int. Cl.
*G01R 31/26* (2020.01)

(52) U.S. Cl.
CPC ..... *G01R 31/2621* (2013.01); *G01R 31/2642* (2013.01)

(58) Field of Classification Search
CPC .......... G01R 31/2621; G01R 31/2642
See application file for complete search history.

(56) References Cited

U.S. PATENT DOCUMENTS

| 6,476,632 | B1 | 11/2002 | La Rosa et al. |
| 6,653,856 | B1 | 11/2003 | Liu |
| 6,903,564 | B1 | 6/2005 | Suzuki |
| 6,933,731 | B2 | 8/2005 | Reddy et al. |
| 7,642,864 | B2 | 1/2010 | Chuang et al. |

(Continued)

FOREIGN PATENT DOCUMENTS

| CN | 1742209 | 3/2006 |
| CN | 102072781 | 5/2011 |

(Continued)

OTHER PUBLICATIONS

International Preliminary Report on Patentability dated Apr. 7, 2017 From the International Preliminary Examining Authority Re. Application No. PCT/IL2016/050476. (20 Pages).

(Continued)

*Primary Examiner* — Patrick Assouad
*Assistant Examiner* — Haidong Zhang

(57) ABSTRACT

A ring oscillator test circuit, includes an odd number of stages, where each stage includes a load and drive transistor connected in series at a common node. The common node of each stage is electrically connected to the drive transistor gate of the following stage, and the common node of the last stage is connected to the drive transistor gate of the first stage. A first voltage input connects to the drains of all the load transistors. A second voltage input connects to the gates of all of the load transistors. A reference voltage input connects to the sources of all of the drive transistors. At least one of the common nodes connects to a test output.

9 Claims, 10 Drawing Sheets

(56) References Cited

U.S. PATENT DOCUMENTS

| | | | |
|---|---|---|---|
| 2008/0024232 A1* | 1/2008 | Gonzalez | G11C 29/006 331/57 |
| 2008/0036531 A1* | 2/2008 | Boe | H02M 3/07 327/538 |
| 2009/0189703 A1 | 7/2009 | Chuang et al. | |
| 2013/0015876 A1 | 1/2013 | Lai et al. | |
| 2013/0015896 A1 | 1/2013 | Li | |
| 2015/0091658 A1* | 4/2015 | Shima | H03L 7/24 331/8 |

FOREIGN PATENT DOCUMENTS

| | | |
|---|---|---|
| CN | 102175962 | 9/2011 |
| WO | WO 2016/178232 | 11/2016 |

OTHER PUBLICATIONS

International Search Report and the Written Opinion dated Nov. 15, 2016 From the International Searching Authority Re. Application No. PCT/IL2016/050476. (11 Pages).

JEDEC "Failure Mechanisms and Models for Semiconductor Devices", JEDEC Solid State Technology Association, JEP122G (Revision of JEP122F), P.i-iv, 1-98, Nov. 2010.

Notification of Office Action and Search Report dated Aug. 7, 2019 From the National Intellectual Property Administration of the People's Republic of China Re. Application No. 201680025949.4 and Its Translation Into English. (20 Pages).

Notification of Office Action dated Feb. 27, 2020 From the National Intellectual Property Administration of the People's Republic of China Re. Application No. 201680025949.4 and Its Translation Into English. (18 Pages).

\* cited by examiner

RING OSCILLATOR TEST CIRCUIT

RELATED APPLICATIONS

This application is a National Phase of PCT Patent Application No. PCT/IL2016/050476 having International filing date of May 5, 2016, which claims the benefit of priority under 35 USC § 119(e) of U.S. Provisional Patent Application No. 62/156,957 filed on May 5, 2015. The contents of the above applications are all incorporated by reference as if fully set forth herein in their entirety.

FIELD AND BACKGROUND OF THE INVENTION

The present invention, in some embodiments thereof, relates to a ring oscillator test circuit for transistors, and, more particularly, but not exclusively, to testing transistor failure mechanisms using the test circuit.

The reliability of sophisticated semiconductor devices is typically calculated based on the assumption of one dominant failure mechanism. The failure rate is generally determined from published handbook values that are based on accelerated life-tests where zero failures were found. The failure rate is reported as a constant time-independent probability, known as "Failure In Time" (FIT). The FIT value that a manufacturer reports is mathematically the inverse of the mean time-to-fail (MTTF) times $10^9$ failures per part-hour.

Today, there is no qualification standard that accepts failures. Thus, the reported FIT is invariably based on a zero-failure result from a tailored accelerated life test. The test is based on what is assumed to be the dominant failure mechanism, but this is never verified since there were no failures to analyze. The result of this "single potential mechanism" accelerated test (that never caused a failure to occur) results in a misleading assessment of the device reliability when multiple mechanisms exist. This contradiction is recognized in JEDEC Solid State Technology Association Publication JEP 122G Rev. October 2011, which states: "When multiple failure mechanisms and thus multiple acceleration factors are involved, then a proper summation technique, e.g., sum-of-the-failure rates method, is required." However, neither this standard nor any other handbook suggests what exactly is a "proper summation technique".

Ring oscillators are well known vehicles for determining the inherent characteristics of a semiconductor electronic device. When measuring low voltage devices, the maximum allowed drain voltage and gate voltages are the same, which makes this a way to test intrinsic device characteristics of a micro-scale or VLSI device.

Newly introduced wide band gap semiconductor power devices are known to exhibit more than a single failure mechanism, such as hot carrier injection, time-dependent dielectric breakdown, negative bias temperature instability (NBTI), single-event gate rupture, electromigration, avalanching and current crowding effects. These mechanisms, as well as solder, packaging and other thermal related failures, may result in failures of newly developed power devices. Now that Gallium nitride (GaN) has been introduced as a new material for high efficiency power conversion, there is a need to determine the reliability of GaN semiconductor devices as well.

Power devices are often tested by incorporating them into actual circuits which may be stressed and tested for performance. However, when power devices are fabricated, the maximum rated drain voltage may be much larger than the maximum gate voltage, making a simple ring-oscillator irrelevant for testing of discrete high voltage or high power devices.

Additional background art includes U.S. Pat. Nos. 6,476,632, 6,653,856 and 6,903,564 and 6,933,731.

SUMMARY OF THE INVENTION

Embodiments herein present a ring oscillator (RO) test circuit for transistors, optionally power transistors. The transistors all operate in the same mode (i.e. enhancement-mode only or depletion-mode only). The test circuit thus accommodates enhancement-mode only technologies such as GaN and Silicon carbide (SiC). GaN and SiC transistors are equivalent to NMOS-only circuitry, which does not automatically 'ring' in conventional ring oscillator circuits.

The RO test circuit includes an odd number of stages, where the minimum number of stages is three. Each stage contains a load transistor and a drive transistor which are connected in series to form an output node. The load transistor gates are connected to voltage source, V2, and the load transistor drains are connected to voltage source V1. The output from each stage is fed to the gate of the drive transistor of the following stage, until the output of the last stage is fed back to the first drive transistor gate. All of the transistors operate in the same mode (enhancement or depletion), and are optionally the same type (e.g. model) of transistor. In alternate embodiments, the transistors all operate in the same mode but are of different types.

By varying the relative values of V1 and V2 the transistors may be tested under different test conditions, such as High Voltage Gate Bias (HVGB) and High Voltage Reverse Bias (HVRB).

According to an aspect of some embodiments of the present invention there is provided a ring oscillator test circuit. The test circuit includes: first, second and reference voltage inputs, a test output and an odd number of stages, where each stage includes a load transistor and drive transistor connected in series at a common node. Each load transistor includes a drain connection electrically connected to the first voltage input, a gate connection electrically connected to the second voltage input, and a source connection. Each drive transistor includes a drain connection electrically connected to the source connection of the load transistor at the common node, a gate connection, and a source connection electrically connected to the voltage reference input. The drive transistor and load transistors operate in the same mode. The stages are ordered from a first stage to a last stage, the common node of the last stage is electrically connected to a gate of the drive transistor of the first stage, and the common node of each other one of the stages is electrically connected to the gate of the drive transistor of a respective next stage. The test output is electrically connected to one of the common nodes.

According to some embodiments of the invention, all of the transistors are enhancement mode transistors.

According to some embodiments of the invention, all of the transistors are depletion mode transistors.

According to some embodiments of the invention, all of the transistors are a same type of transistor.

According to some embodiments of the invention, all of the transistors are Gallium nitride (GaN) transistors.

According to some embodiments of the invention, all of the transistors are Silicon carbide (SiC) transistors.

According to some embodiments of the invention, all of the transistors are Gallium arsenide (GaAs) transistors.

According to some embodiments of the invention, the test circuit further includes at least one sensor which monitors a respective circuit performance measure.

According to an aspect of some embodiments of the present invention there is provided a method of testing transistors in a test circuit. The test circuit includes: first, second and reference voltage inputs, a test output and an odd number of stages, where each stage includes a load transistor and drive transistor connected in series at a common node. Each load transistor includes a drain connection electrically connected to the first voltage input, a gate connection electrically connected to the second voltage input, and a source connection. Each drive transistor includes a drain connection electrically connected to the source connection of the load transistor at the common node, a gate connection, and a source connection electrically connected to the voltage reference input. The stages are ordered from a first stage to a last stage.

The common node of the last stage is electrically connected to the gate of the drive transistor of the first stage, and the common node of each other one of the stages is electrically connected to the gate of the drive transistor of a respective next stage.

The test output is electrically connected to one of the common nodes. All of the load and drive transistors operate in the same mode. The method includes: inputting a first voltage level into the first voltage input and a second voltage level into the second voltage input, monitoring an output signal at the test output, and analyzing the output signal to evaluate transistor performance.

According to some embodiments of the invention, all of the transistors are enhancement mode transistors.

According to some embodiments of the invention, all of the transistors are depletion mode transistors.

According to some embodiments of the invention, all of the transistors are a same type of transistor.

According to some embodiments of the invention, the first and second voltage levels are selected to cause ringing in the test circuit.

According to some embodiments of the invention, analyzing the output signal includes monitoring at least one of an output signal frequency and an output signal voltage level or current over time and identifying changes in the signal frequency and voltage or current level.

According to some embodiments of the invention, the method further includes inputting a third voltage level into the first voltage input and a fourth voltage level into the second voltage input and monitoring the output signal at the test output.

According to some embodiments of the invention, the first and second voltage levels create a first test condition for the transistors in the circuit and the third and fourth voltage levels create a second test condition for the transistors in the circuit, and the method further includes switching the circuit between the first test condition and the second test condition.

According to some embodiments of the invention, the first voltage level and the second voltage level are selected independently.

According to some embodiments of the invention, the first voltage level is set to a high voltage and the second voltage level is set to prevent current flow through the transistor, so as to test the transistors in a high voltage reverse bias (HVRB) condition.

According to some embodiments of the invention, the first voltage level is set to a zero bias and the second voltage level is set to enable current flow through the transistor, so as to test the transistors in a high voltage gate bias (HVGB) condition.

According to an aspect of some embodiments of the present invention there is provided a method of providing a test circuit. The method includes creating an odd number of transistor pair stages by connecting a load transistor to a respective drive transistor at a common node. The drain connections of all of the load transistors are connected to a first voltage input. The gate connections of all of the load transistors are connected to a second voltage input. The source connections of all of the drive transistors are connected to a voltage reference input. The stages are ordered from a first stage to a last stage. The common node of the last stage is connected to the gate of the drive transistor of the first stage. The common nodes of the other stages are connected to the gate of the drive transistor of the respective next stage. A test output is connected to one of the common nodes. All of the transistors have the same mode of operation.

According to some embodiments of the invention, all of the transistors are enhancement mode transistors.

According to some embodiments of the invention, all of the transistors are depletion mode transistors.

According to some embodiments of the invention, all of the transistors are a same type of transistor.

According to some embodiments of the invention, all of the transistors are Gallium nitride (GaN) transistors.

According to some embodiments of the invention, all of the transistors are Silicon carbide (SiC) transistors.

According to some embodiments of the invention, all of the transistors are Gallium arsenide (GaAs) transistors.

The method may comprise connecting additional inductances between respective stages and/or connecting capacitances to each of the gate connections.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
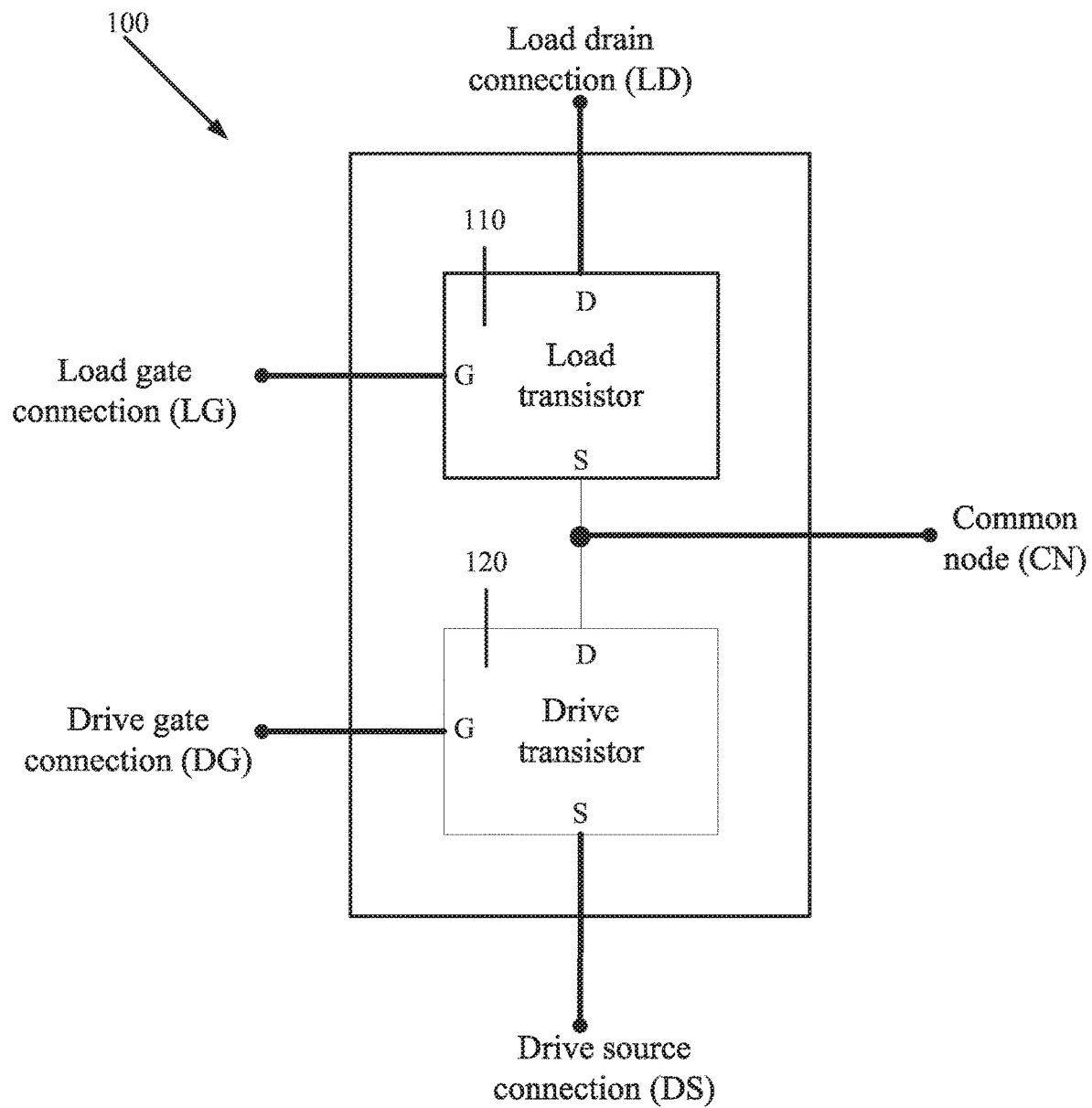
FIG. 1 is a simplified block diagram of a stage of a test circuit, according to embodiments of the invention.

The present invention, in some embodiments thereof, relates to a ring oscillator test circuit for transistors, and, more particularly, but not exclusively, to testing transistor failure mechanisms using the test circuit.

Embodiments herein present an RO test circuit (also denoted a "test circuit") with independent control of transistor drain and gate voltages. Thus the same circuit may be used to test and evaluate multiple aspects of transistor performance. Some embodiments of the invention use N-type, electron only, enhancement mode transistors and provide the ability to test the transistors at high drain voltages with low current as well as at high current with proper drain voltages. The RO test circuit is suitable for modern power devices made with GaN, SiC, GaAs or other non-Silicon materials which generally function only as N-type enhancement mode.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways, including a depletion mode only configuration.

Test Circuit Configuration

Referring now to the drawings, FIG. 1 is a simplified block diagram of a stage of a test circuit, according to embodiments of the invention. Stage 100 includes two transistors, load transistor 110 and drive transistor 120. Both transistors operate in the same mode (i.e. both in enhancement mode or both in depletion mode). Load transistor 110 and drive transistor 120 are connected in series, with the load transistor source and the drive transistor drain connected to form a common node (CN).

Stage 100 has three other connection points:
i) Load gate connection (LG);
ii) Load drain connection (LD);
iii) Drive gate connection (DG); and
iv) Drive source connection (DS).

An odd number of stages (three and above) are connected together to form a ring oscillator test circuit as described below.

As used herein the term "connection" means a location where an electronic signal enters or leaves the transistor, and is not intended to be limiting to a physical connector connected to the transistor. The connection may be internal to the test circuit.

Figure 2:
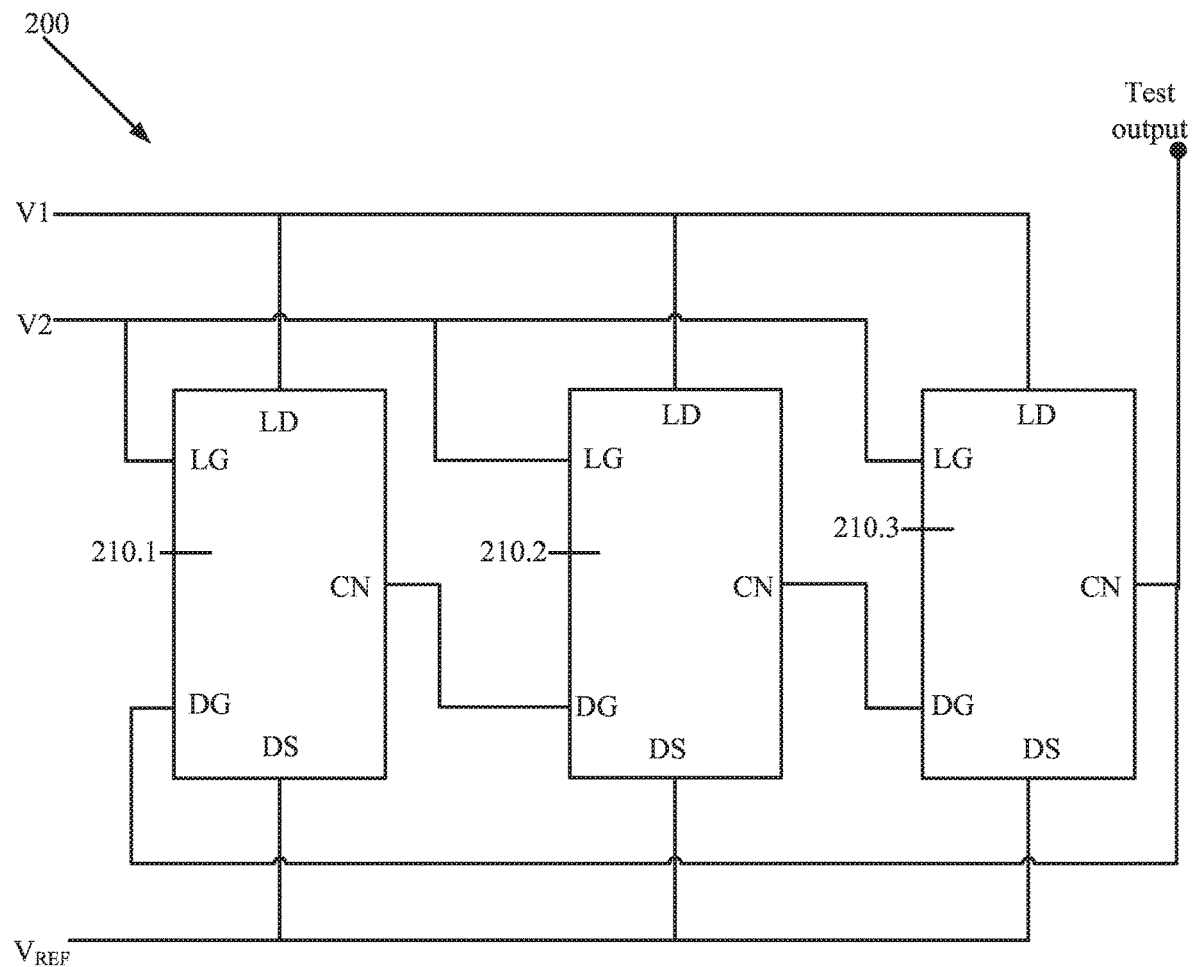
FIG. 2 is a simplified block diagram of a three-stage ring oscillator test circuit, according to embodiments of the invention.
Figure 7:
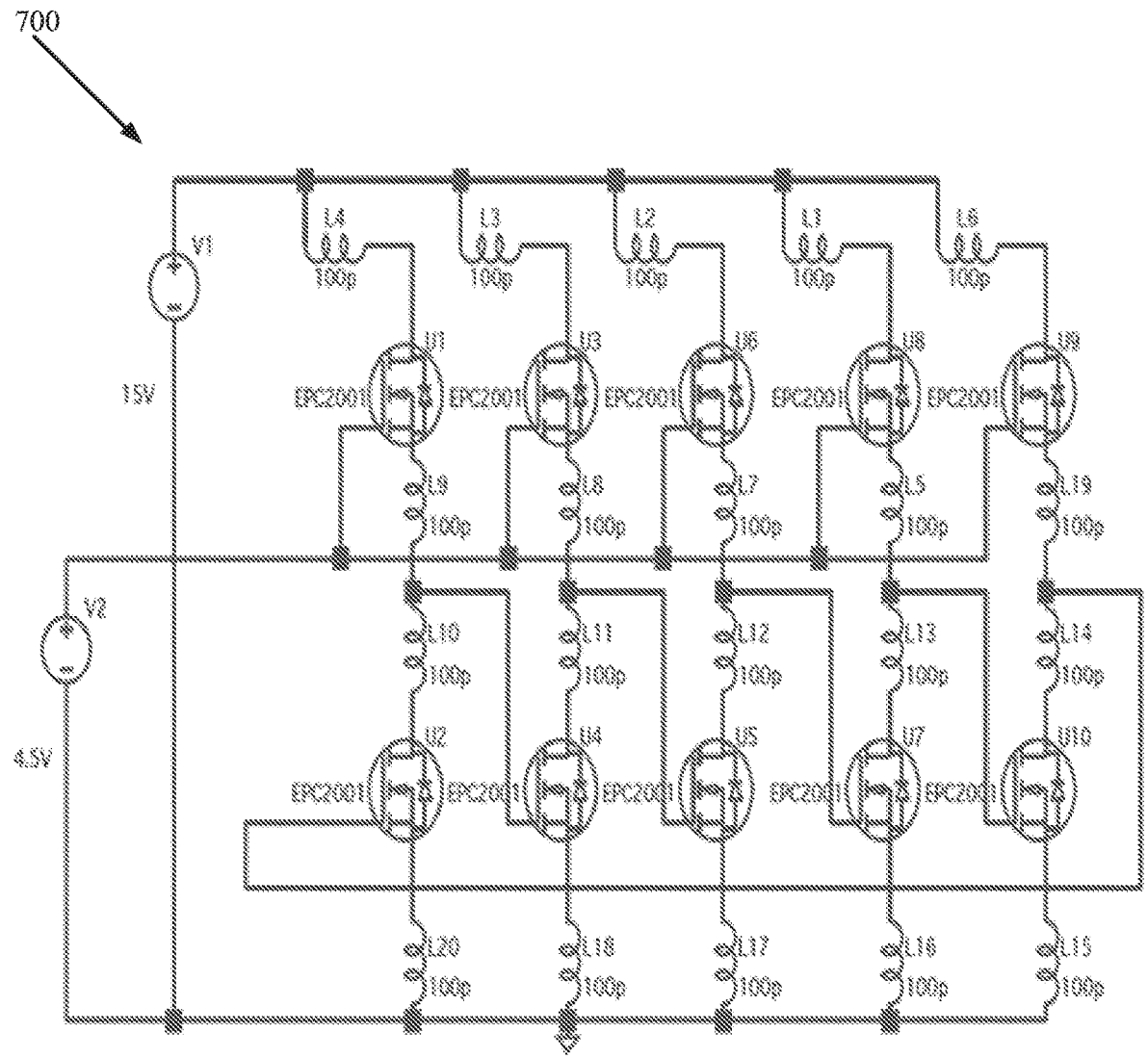
FIG. 7 is a simplified circuit diagram according to a second exemplary embodiment of the invention.

Reference is now made to FIG. 2 which is a simplified block diagram of a three-stage ring oscillator test circuit, according to embodiments of the invention. FIG. 2 illustrates an embodiment with the minimal number of stages, 210.1, 210.2 and 210.3. Other embodiments of the RO test circuit include additional pairs of transistor stages so that the total number of stages remains odd. An exemplary embodiment of a five-stage RO test circuit is illustrated in FIG. 7.

The load transistor drains (LDs) of all stages connect to V1. The load transistor gates (LGs) of all stages connect to V2. The drive transistor sources (DSs) of all stages connect to reference voltage $V_{REF}$. The common node (CN) from each stage connects to the drive transistor gate (DG) of the following stage, with the common node of the final stage connecting to the drive transistor gate of the first stage. At least one of the common nodes serves as a test output.

Optionally the RO test circuit includes one or more sensors (not shown) for monitoring additional performance measures of interest (e.g. the current through a stage, temperature, etc.). The sensors may impose additional load on the test circuit device which affect the circuit's natural ring. This additional load should be factored into the analysis of transistor performance.

The gate-to-source voltages on the load and drive transistors determine the drain current. When current flows, the output of each stage goes low, below the threshold voltage of the next drive transistor. This turns off the current of the following stage, causing the next voltage to rise, which, then turns on the next stage.

The result is a ring oscillation, allowing the frequency, amplitude and currents of the transistors in the test circuit to be monitored. Typically V2 does not need to deliver much current since V2 serves only as the LG control voltage.

Optionally, all the transistors in the RO circuit are enhancement mode transistors. In alternate embodiments, all the transistors in the RO are depletion mode transistors.

Optionally, all of the transistors in the RO circuit are the same type of transistor. As used herein the term "type" means that the electrical characteristics, and optionally physical characteristics, of the transistors are substantially the same.

Typically transistors of the same type are manufactured to the same specifications, for example during production of a commercially available component or during prototype development.

Optionally all the transistors in the RO circuit are Gallium nitride (GaN) transistors. In alternate embodiments all of the transistors in the RO circuit are Silicon carbide (SiC) transistors. In further alternate embodiments, all of the transistors in the RO circuit are Gallium arsenide (GaAs) transistors.

Figure 3:
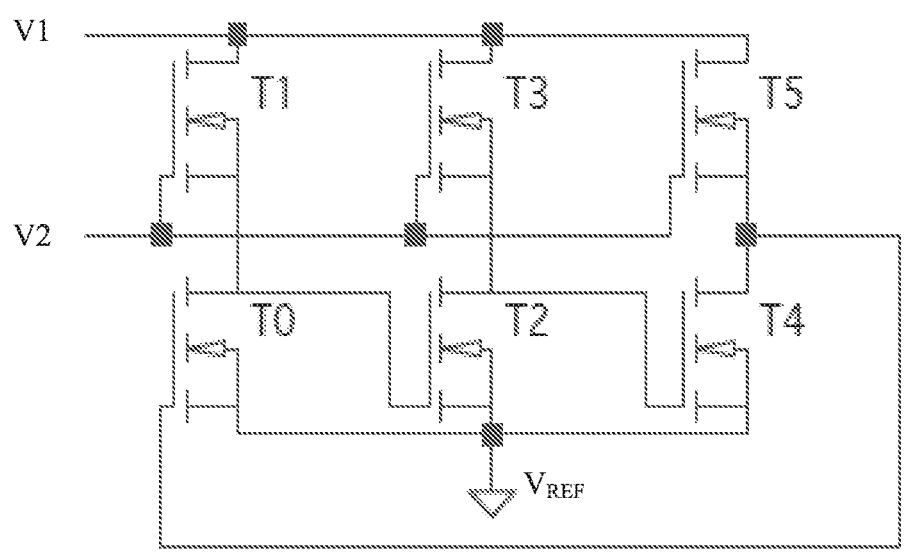
FIG. 3 is a simplified block diagram of a three-stage ring oscillator test circuit, according to embodiments of the invention.

Reference is now made to FIG. 3 which is a simplified block diagram of a three-stage ring oscillator test circuit, according to embodiments of the invention.

The first stage includes transistors T1 and T0 connected in series. The second stage includes transistors T3 and T2 connected in series. The third stage includes transistors T5 and T4 connected in series. V1 connects to the drains of T1, T3 and T5; and V2 connects to the gates of T1, T3 and T5. The T1-T0 common node connects to the gate of T2; the T3-T2 common node connects to the gate of T4; and the T5-T4 common node loops back to the gate of T0.

Optionally the RO test circuit is provided (e.g. manufactured) by connecting transistors having the same mode of operation substantially as described above.

It is to be understood that the components of the RO test circuit are not limited to transistors. Other electronic and physical components may be included in the circuit, as necessary to obtain an operational test circuit capable of testing the desired type(s) of transistors.

Optionally, all of the transistors in the RO test circuit are enhancement mode transistors. In alternate embodiments all of the transistors in the RO test circuit are depletion mode transistors.

Optionally all of the transistors are of the same type.

Optionally all the transistors in the RO test circuit are Gallium nitride (GaN) transistors. In alternate embodiments all of the transistors in the RO circuit are Silicon carbide (SiC) transistors. In further alternate embodiments, all of the transistors in the RO circuit are Gallium arsenide (GaAs) transistors.

Test Circuit Operation

One feature of the RO test circuit described herein is that V1 and V2 may be controlled independently in order to create different voltage and/or current stress conditions. The gate voltage (V2) may be chosen above the threshold voltage of the gate while the drain voltage (V1) is set higher than a voltage above which the circuit will start to ring.

The resulting ring frequency and amplitude depends on the performance of all the transistors working together. Since the current in both the load and the drive transistors is the same, the voltage between the gate and source of both the load and drive transistors are likewise the same and is controlled by the current through the transistors.

The voltage characteristic at some or all of the drive transistor gates affects the ring frequency and amplitude based on the transistor device characteristics. Degradation due to stress across the devices may be reflected in a threshold voltage shift and/or change in ring frequency and/or increase in transconductance.

By observing the performance characteristics of the test circuit under fixed and/or changing drive conditions the degradation in transistor performance may be evaluated. The degradation may be recorded over time, and a time to fail may be extrapolated or measured and fit with appropriate physics of failure mechanisms that could result from the tested conditions. These tests may then be performed also at high and low temperatures in a controlled environment in order to extrapolate reliability characteristics.

Many different test conditions are possible in order to separate the effects of current and voltage. In a first example, the gate voltage, V2 is set to zero while V1 is raised as much as required to stress the high voltage characteristics. This is a zero current, High Voltage Reverse Bias (HVRB) test condition. The HVRB test may be performed at any temperature, and then the voltages may be switched back to an oscillation state in order to determine the effects of this stress. The time between test intervals may be recorded over hours or days in order to determine the effects of this HVRB condition. The characteristic degradation may then be fitted to a reliability model and a lifetime or failure rate at that condition may be extrapolated.

In a second example, the RO circuit is used to test the integrity of the gate insulation using the High Voltage Gate Bias (HVGB) test. HVGB is performed with zero bias on the drain at V1 and a high gate voltage at V2. In this condition, the transistor current is controlled by the applied drain voltage, V1. By varying V1 and V2 multiple tests may be performed under these stress conditions. The effects of high current stress may thus be tested under active conditions. By stressing the transistors with high current at low voltage, the hot carrier injection type of failure mechanism may be observed.

In a third example, drain voltage V1 is raised while the test circuit is ringing in order to observe the continued performance at a given current condition for a fixed gate voltage, V2. The time to fail may then be measured relative to a tested circuit source current (i.e. the current into the test circuit at a given level of V1). Furthermore, the power dissipated by the circuit may also be used as a parameter for determining the time to failure.

Figure 4:
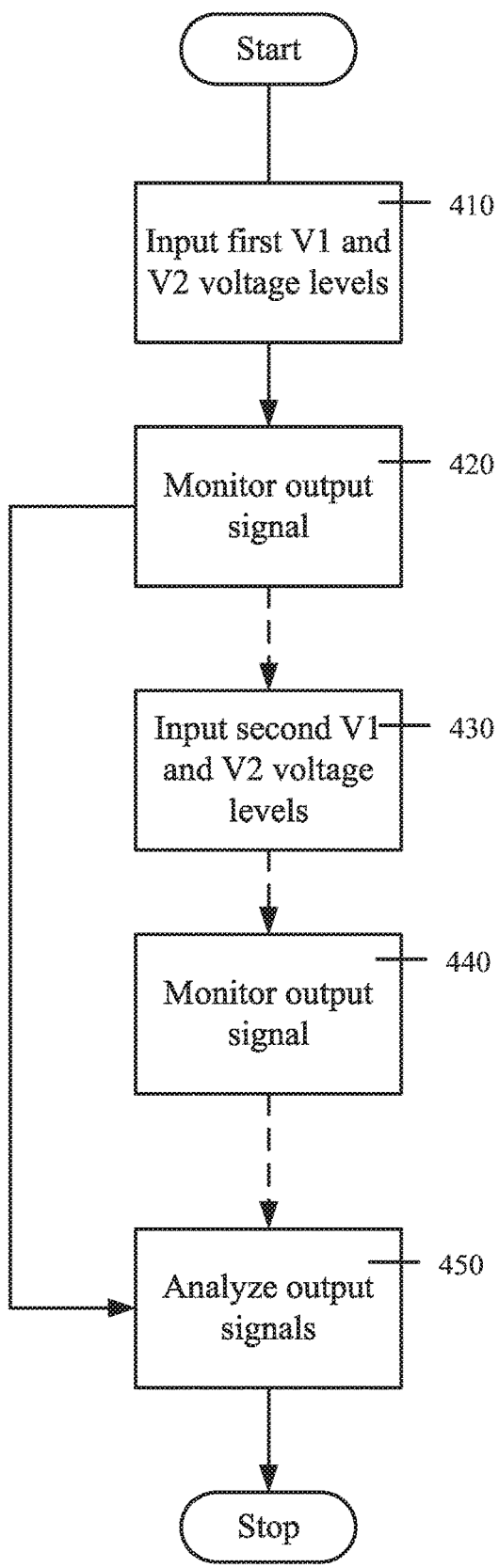
FIG. 4 is a simplified block diagram of a method for testing transistors in an RO test circuit, according to embodiments of the invention.

Reference is now made to FIG. 4, which is a simplified block diagram of a method for testing transistors in an RO test circuit, according to embodiments of the invention. The method stresses transistors in the RO test circuit, under one or more conditions. The conditions are established by setting the V1 and V2 voltage levels.

In 410 a first voltage level is input into V1 and a second voltage level is input into V2. In 420 the test circuit output signal is monitored under these test conditions.

Optionally, the test circuit transistors are tested under at least one more test condition by inputting different levels into V1 and/or V2 and monitoring the circuit under the further test conditions (430 and 440). In 450, the test circuit output signal(s) are analyzed to evaluate transistor performance.

Optionally, in at least one of the test conditions the input voltages are selected to cause the circuit to ring.

Optionally, the analysis is based at least in part on an analysis of ring frequency and/or output signal amplitude. Further optionally, the analysis is based on changes in ring frequency and/or output signal amplitude over time (e.g. degradation in ring amplitude).

Optionally the test circuit is tested under at least one of:
i) HVRB test conditions;
ii) HVGB test conditions; and
iii) Switching between HVRB and HVBG conditions.

Optionally, the test circuit output is monitored under varying temperature and/or environmental conditions, and transistor performance is evaluated for these different conditions.

Optionally, at least one of the following is measured:
1) Ring frequency;
2) Frequency changes over time;

3) Amplitude;
4) Amplitude changes over time;
5) Source voltage level;
6) Source current (out of V1); and
7) Leakage current (out of V2).

It is expected that during the life of a patent maturing from this application many relevant types of transistors, transistor modes, transistor materials, tests, test conditions and transistor performance measures will be developed and the scope of the term transistor, modes, material, test, test condition and performance measure is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find calculated support in the following examples.

EXAMPLES

Reference is now made to the following examples, which together with the above descriptions illustrate some embodiments of the invention in a non limiting fashion.

Figure 5:
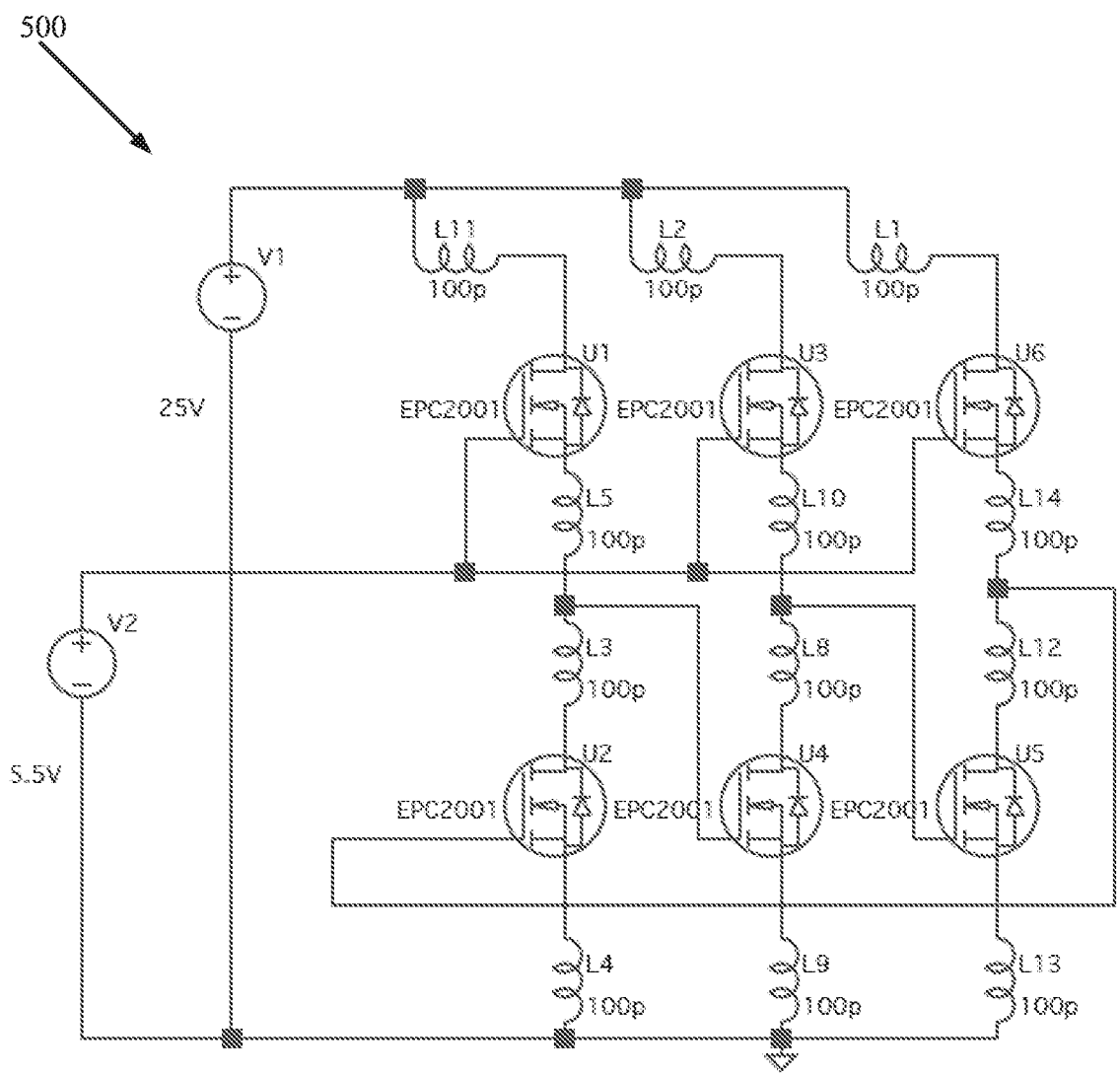
FIG. 5 is a simplified circuit diagram according to a first exemplary embodiment of the invention.

Reference is now made to FIG. 5, which is a simplified circuit diagram according to a first exemplary embodiment of the invention. Test circuit 500 includes three stages, each stage including a load and drive transistor connected in series. The type of all the transistors in the circuit is EPC2001. The 100 pH inductors (L1-L5 and L8-L14) simulate minimal circuit board wiring between the transistors but are not components of test circuit 500.

Test circuit 500 is simulated in two modes. In one mode the gate voltage, V2, is shorted to ground (zero volts) and the drain voltage, V1, is raised to stress the high voltage characteristics. The second mode is with positive gate voltage V2 while the drain voltage V1 is lowered until the current through the devices is high enough to stress in the second mode. Thus, there are two modes of stress: High Voltage Low Current and High Current Low Drain Voltage. The drain voltage may be raised as much as is needed during the high current oscillation test until the power capacity of the devices is exceeded. The representative circuit is shown with fixed respective voltages at the Drain and the Gate, where the voltages are chosen to cause oscillating current stress in the devices. The performance of the devices is related to the ring frequency and the time to degradation or total failure.

Figure 6:
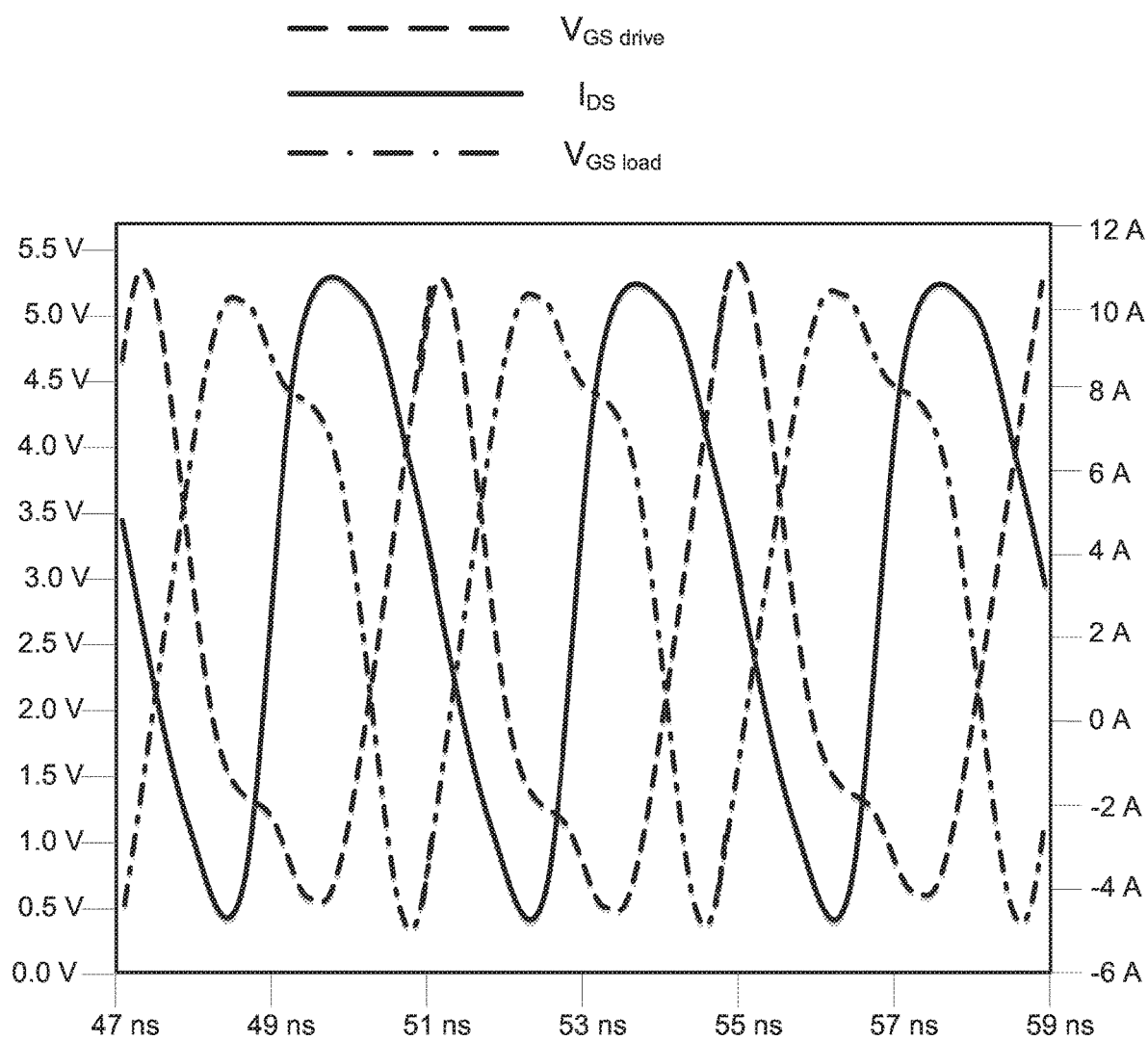
FIG. 6 shows voltage and current behavior for the test circuit of FIG. 5.

Reference is now made to FIG. 6, which shows voltage and current behavior for test circuit 500. FIG. 6 shows three curves, two of which are the gate to source voltages across two of the transistors. $V_{GS\_drive}$ is the gate voltage of the drive transistor, while curve $V_{GS\_load}$ is the gate to source voltage of the serially-connected load transistor (both plotted relative to the left side axis). The resulting current through the transistors, IDs is plotted relative to the right side axis. Voltage V2 is chosen such that the current is sufficient for the test to cause failure or lead to degradation which is measured as the output frequency, as well as circuit voltage and current. Dramatic ringing is observed and may be monitored externally.

Reference is now made to FIG. 7, which is a simplified circuit diagram according to a second exemplary embodiment of the invention. Test circuit 700 includes five stages, each stage including a load and drive transistor connected in series. The type of all the transistors in the circuit is EPC2001. The 100 pH inductors (L1-L20) simulate minimal circuit board wiring between the transistors but are not components of test circuit 700. Again, voltages V1 and V2 are chosen to cause the test circuit to ring and to allow measurements of the device performance.

Figure 8:
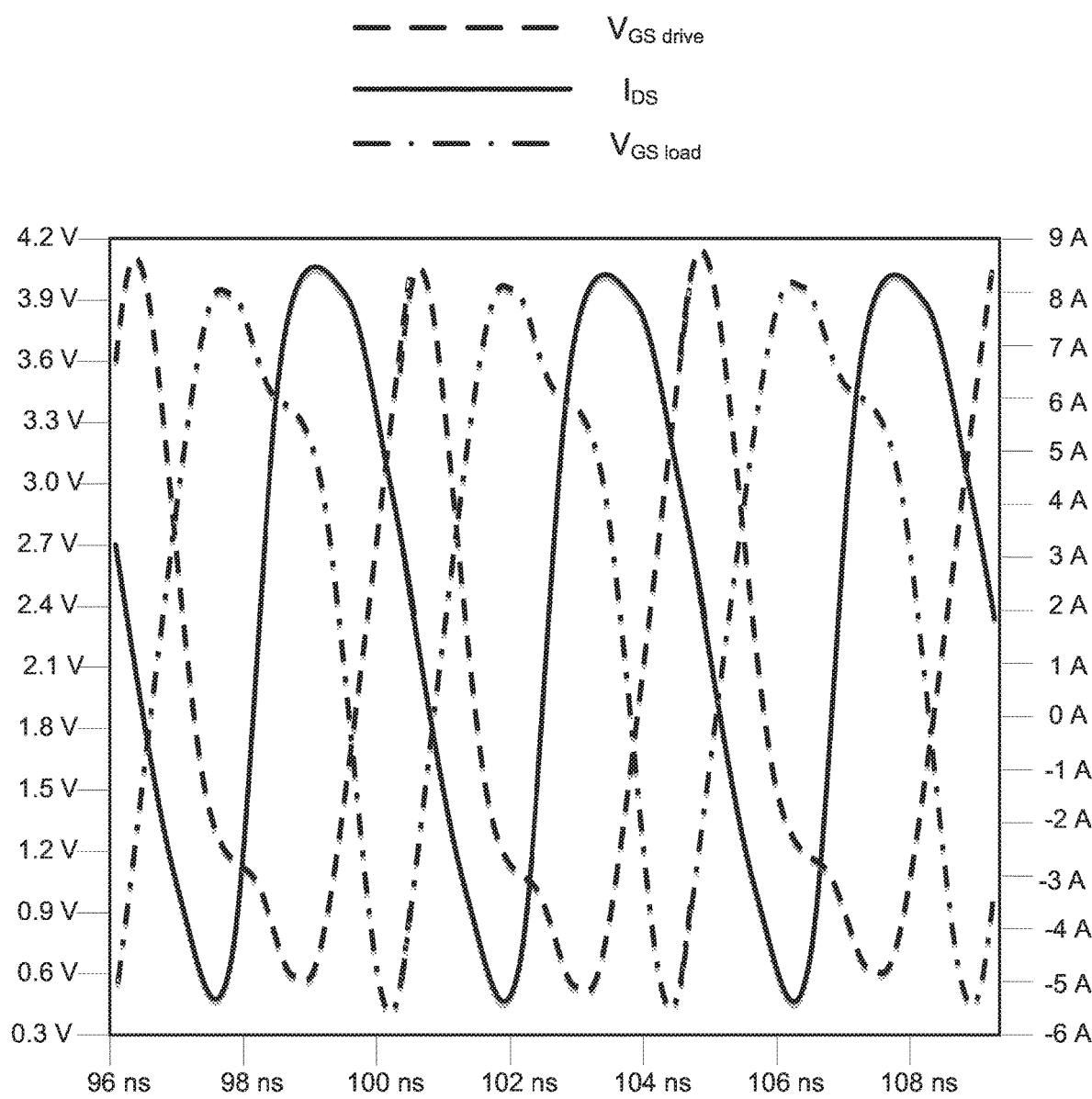
FIG. 8 shows voltage and current behavior for the test circuit of FIG. 7.

Reference is now made to FIG. 8, which presents voltage and current behavior for test circuit 700. FIG. 8 shows the gate-source voltages of the first stage as well as the current through the transistors. Dramatic ringing is observed and may be monitored externally.

Figure 9:
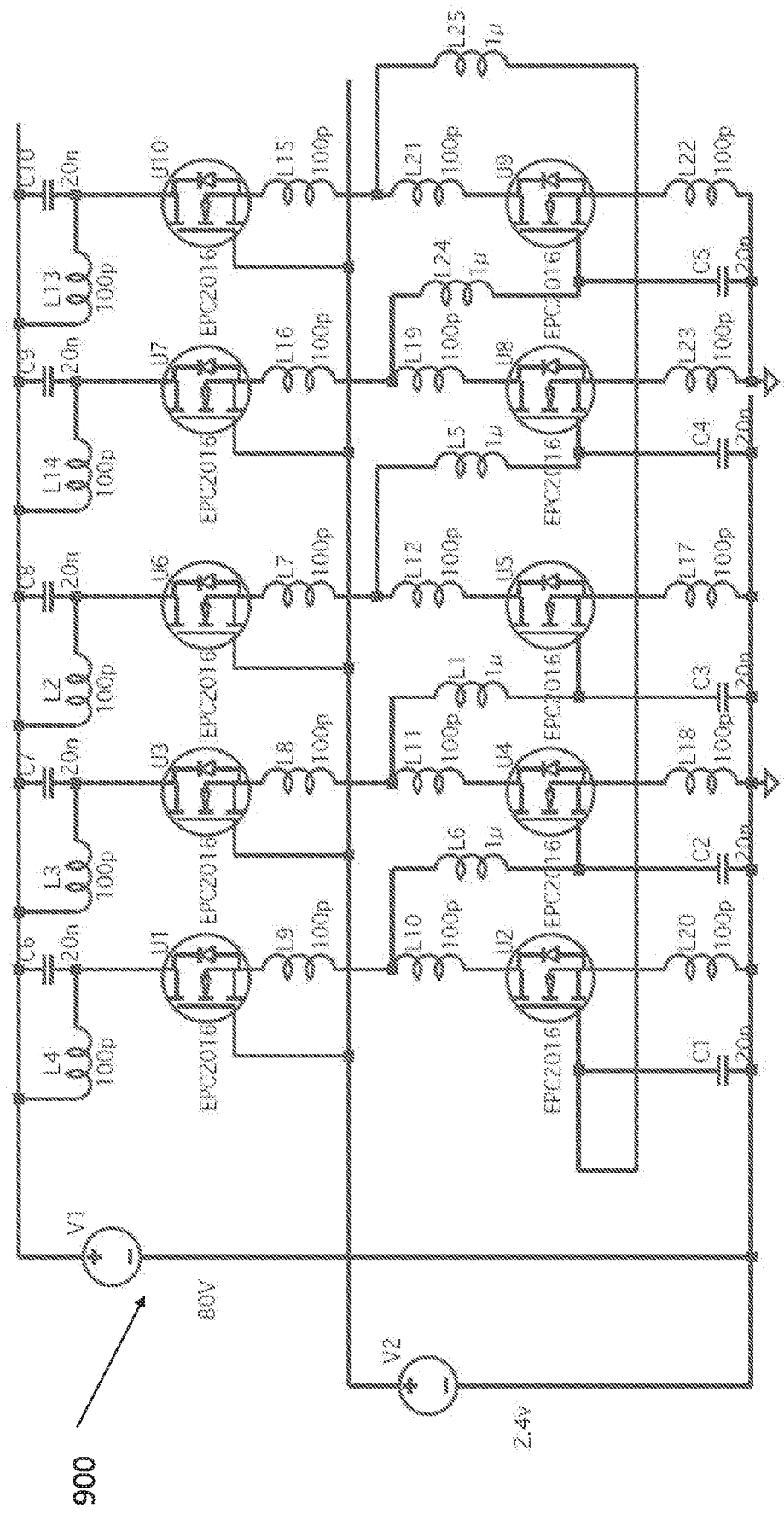
FIG. 9 shows a simplified circuit diagram according to an additional embodiment of the present invention.

Reference is now made to FIG. 9, which is a simplified circuit diagram according to a third exemplary embodiment of the invention. Test circuit 900 includes five stages, each stage including a load and drive transistor connected in series. The type of all the transistors in the circuit is EPC2016. The 100 pH inductors simulate minimal circuit board wiring between the transistors but are not components of test circuit 900, in the same way as they were not components of circuit 700.

Circuit 900 takes into account internal inductances L1, L5, L6, L24 and L25, so that the frequency is reduced and the voltage swing is increased. What the circuit recognizes is that the wire connecting the output of the previous stage to the gate of the next stage may include additional inductance and this can be taken advantage of to slow down the response and allow a more controlled ring. As shown, in each case the internal inductance is increased to 1 uH between stages by the insertion of additional inductances. Alternatively or additionally, an added capacitance to the gates, (20 nF) at C1-C5 and C6-C10, may serve, alone or with the added inductance, to bring down the frequency to 1 MHz. The inductances may also be added without the capacitances, and in a further embodiment, capacitances and/or inductances may be added to one or more of the stages but not to one or more other stages. The current profile may be improved, by the addition of inductance or capacitance as described, as the current ranges between zero and a maximum value.

Again, voltages V1 and V2 are chosen to cause the test circuit to ring and to allow measurements of the device performance.

Figure 10:
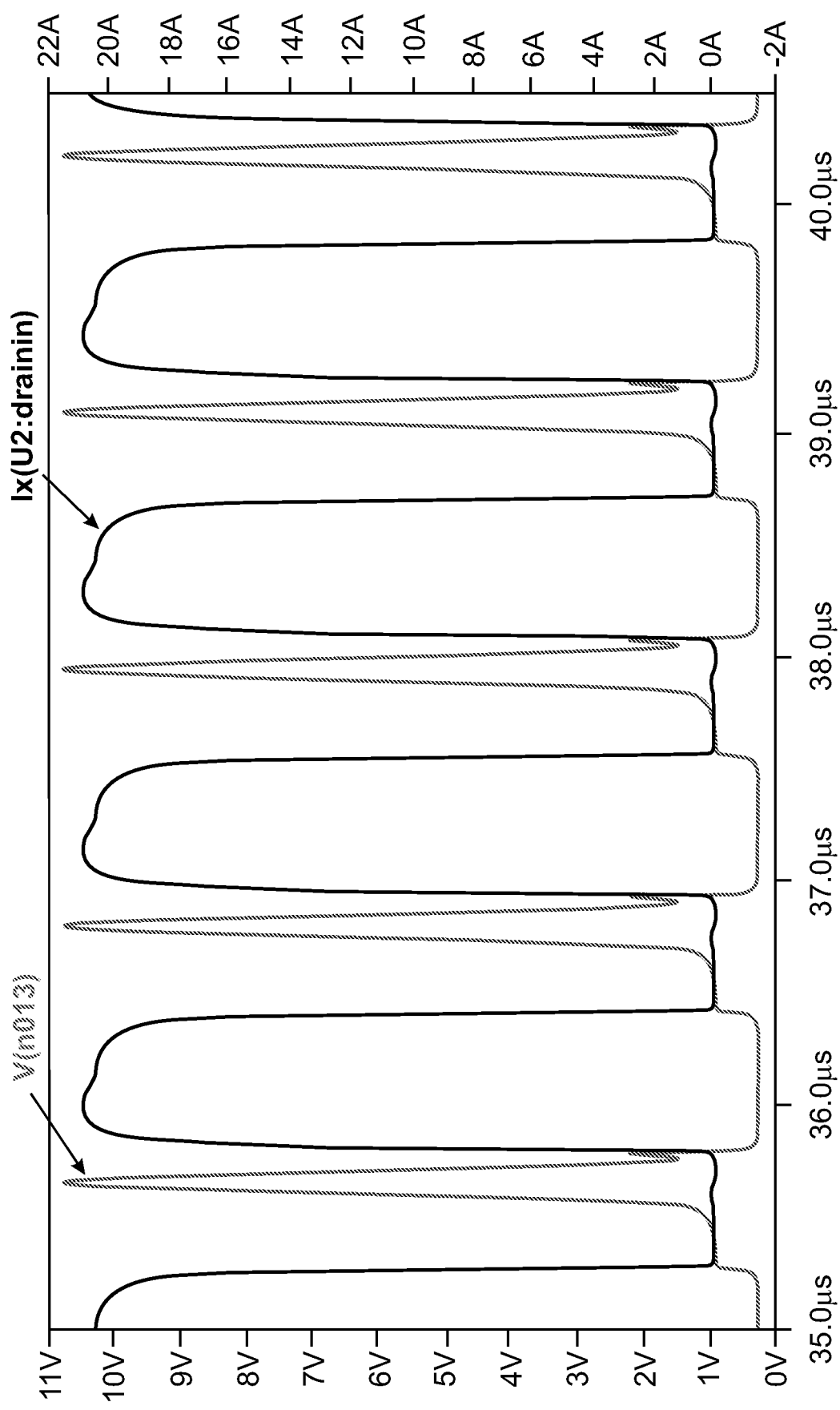
FIG. 10 shows voltage and current behavior for the embodiment of FIG. 9.

Reference is now made to FIG. 10, which presents voltage and current behavior for test circuit 900 of FIG. 9. FIG. 10 shows the gate-source voltages of the first stage as well as the current through the transistors. Ringing is reduced as compared with FIG. 8.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of testing transistors in a test circuit, wherein said test circuit comprises:
   a first voltage input;
   a second voltage input;
   a reference voltage input;
   an odd plurality of stages, each stage comprising:
      i) a load transistor, comprising a drain connection electrically connected to said first voltage input, a gate connection electrically connected to said second voltage input, and a source connection; and
      ii) a drive transistor of a same mode as said load transistor, comprising a drain connection electrically connected to said source connection of said load transistor so as to form a common node, a gate connection, and a source connection electrically connected to said voltage reference input; and
   a test output electrically connected to a respective one of said common nodes,
   wherein said stages are ordered from a first stage to a last stage, said common node of said last stage is electrically connected to a gate of said drive transistor of said first stage, and said common node of each other one of said stages is electrically connected to a gate of a drive transistor of a respective next stage, and wherein all of said transistors are of enhancement mode only technology and operate in a same mode,
   said method comprising:
   inputting a first voltage level into said first voltage input and a second voltage level into said second voltage input, said second voltage input being separate and distinct from a respective common node of said first stage;
   inputting a third voltage level into said first voltage input and a fourth voltage level into said second voltage input, wherein said first and second voltage levels create a first test condition for said transistors in said circuit and said third and fourth voltage levels create a second test condition for said transistors in said circuit;
   switching said circuit between said first test condition and said second test condition;
   monitoring an output signal at said test output; and
   analyzing said output signal to evaluate transistor performance.

2. A method according to claim 1, wherein all of said transistors are enhancement mode transistors.

3. A method according to claim 1, wherein all of said transistors are a same type of transistor.

4. A method according to claim 1, wherein said first and second voltage levels are selected to cause ringing in said test circuit.

5. A method according to claim 1, wherein said analyzing comprises monitoring at least one of an output signal frequency and an output signal voltage level over time and identifying changes in said signal frequency and voltage level.

6. A method according to claim 1, wherein said first voltage level and said second voltage level are selected independently.

7. A method according to claim 1, wherein said first voltage level is set to a high voltage and said second voltage level is set to prevent current flow through said transistor, so as to test respective transistors being tested in a high voltage reverse bias (HVRB) condition.

8. A method according to claim 1, wherein said first voltage level is set to a zero bias and said second voltage level is set to enable current flow through said transistor, so as to test respective transistors being tested in a high voltage gate bias (HVGB) condition.

9. A method according to claim 1, further comprising connecting additional inductances between respective stages and/or connecting capacitances to each of said gate connections.

* * * * *